United States Patent [19]

Asano et al.

[11] Patent Number: 5,162,894
[45] Date of Patent: Nov. 10, 1992

[54] SEMICONDUCTOR INTEGRATED CIRCUIT HAVING A DUMMY LEAD AND SHAPED INNER LEADS

[75] Inventors: Masamichi Asano, Tokyo; Kiyoshi Kobayashi, Kawasaki; Hiroshi Iwahashi; Hiroaki Kishi, both of Yokohama, all of Japan

[73] Assignee: Kabushiki Kaisha Toshiba, Kawasaki, Japan

[21] Appl. No.: 613,455

[22] Filed: Nov. 14, 1990

Related U.S. Application Data

[63] Continuation of Ser. No. 355,612, May 23, 1989, abandoned.

[30] Foreign Application Priority Data

May 24, 1988 [JP] Japan ................. 63-126514
Dec. 23, 1988 [JP] Japan ................. 63-324955

[51] Int. Cl.⁵ .............. H01L 23/48; H01L 29/44; H01L 29/52; H01L 29/60
[52] U.S. Cl. ........................ 257/691; 257/692
[58] Field of Search ............ 357/70, 68, 69, 74, 357/65

[56] References Cited

U.S. PATENT DOCUMENTS

| | | | |
|---|---|---|---|
| 4,010,488 | 3/1977 | Gruszka et al. | 357/70 |
| 4,099,200 | 7/1978 | Koutalides | 377/70 |
| 4,298,883 | 11/1981 | Komatsu et al. | 357/72 |
| 4,466,183 | 8/1984 | Barns | 29/827 |
| 4,680,613 | 7/1987 | Daniels et al. | 357/70 |
| 4,814,855 | 3/1989 | Hodgson et al. | 174/52.4 |

FOREIGN PATENT DOCUMENTS

| | | |
|---|---|---|
| 0090503 | 3/1982 | European Pat. Off. . |
| 0214307 | 3/1987 | European Pat. Off. . |
| 0251880 | 1/1988 | European Pat. Off. . |
| 53-73088 | 6/1978 | Japan . |
| 53-133371 | 11/1978 | Japan ................. 357/70 |
| 57-164548 | 10/1982 | Japan ................. 357/70 |
| 63-73546 | 4/1988 | Japan ................. 357/70 |
| 63-116453 | 5/1988 | Japan ................. 357/70 |
| 86/05322 | 9/1986 | World Int. Prop. O. ...... 357/70 |

OTHER PUBLICATIONS

European Search Report EP 89 10 9390, dated Nov. 27, 1990.
Japanese 57-164548, Sep. 10, 1982, Patent Abstracts of Japan, Jan. 8, 1983.

*Primary Examiner*—Jerome Jackson, Jr.
*Assistant Examiner*—D. Monin
*Attorney, Agent, or Firm*—Finnegan, Henderson, Farabow, Garrett and Dunner

[57] ABSTRACT

A semiconductor integrated circuit includes a semiconductor chip having a plurality of pad electrodes fixed in a lead frame. Electrical leads connected to the chip include outer lead portions, external to the lead frame, and inner lead portions, internal to the lead frame and electrically connected to the semiconductor chip. At least one lead is a dummy lead, providing additional space in the lead frame. Due to the extra space, the inner lead portions may have various shapes, including large leads, or branched leads, for elimination power noise.

8 Claims, 9 Drawing Sheets

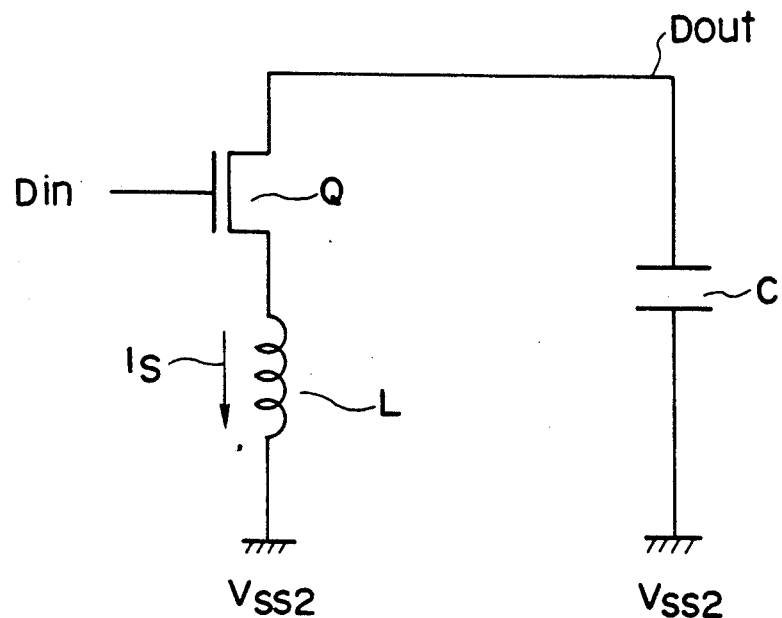
F I G. 3
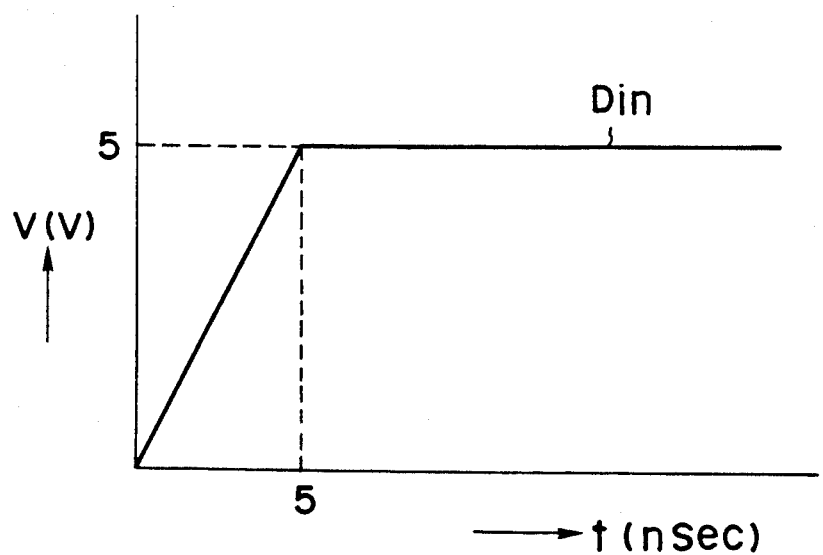
F I G. 4

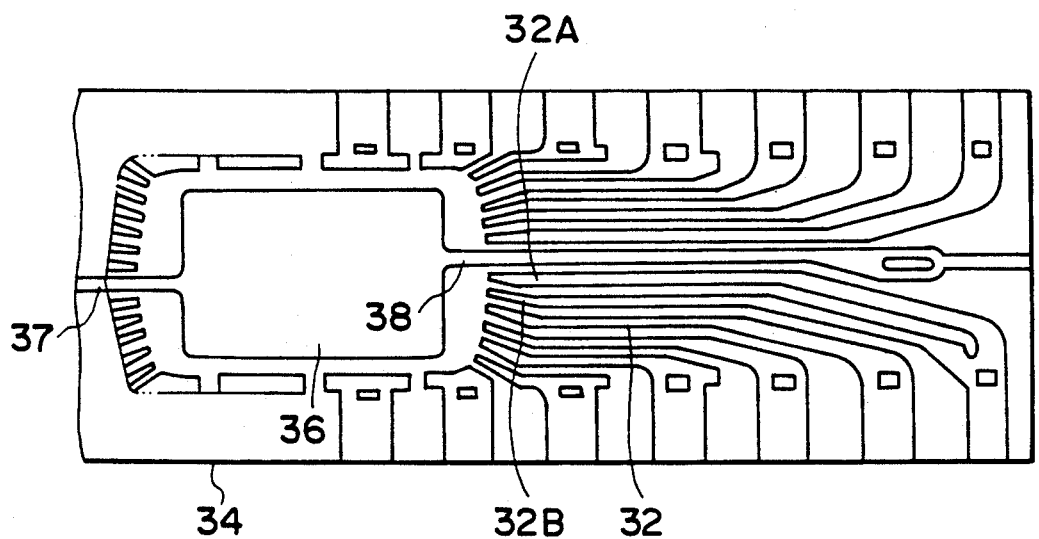
F I G. 12

SEMICONDUCTOR INTEGRATED CIRCUIT HAVING A DUMMY LEAD AND SHAPED INNER LEADS

This application is a continuation of application Ser. No. 07/355,612 filed May 23, 1989, now abandoned.

BACKGROUND F THE INVENTION

1. Field of the Invention

The present invention relates to a semiconductor integrated circuit configured to minimize the adverse effects of power noise caused by an overcurrent.

2. Description of the Related Art

An integrated circuit with either a single or a plurality of functions, in which a great number of semiconductor elements are integrated into a single chip, is commonly known as an IC. The IC chip is housed in a cavity which protects it from the surrounding atmosphere. The semiconductor chip contains many pad electrodes for signal transfers and power supplies.

FIG. 1 illustrates a block diagram of a typical circuit contained in a memory IC chip. External address signals input to the memory circuit first reach pad electrodes 11, 11 of the memory circuit. The address signals are then inputted to an address buffer circuit 12 and to an address decoder circuit 13. By decode signals outputted from the address decoder circuit 13, data of a plurality of bits are read out of a memory 14, and amplified by a sense amplifier circuit 15. The amplified data signals are applied to an output buffer circuit 17. The data signals loaded in the output buffer circuit 17 are output through pad electrodes 18, 18.

To operate the memory IC chip, external power and ground voltages must be supplied. A power voltage Vcc is applied to a power pad electrode 19. Two ground voltages Vss1 and Vss2 are respectively applied to pads 20 and 21 exclusively used for ground voltage application. Pad electrodes 18, 18 for data outputting contain parasitic capacitances that are treated as a load capacitor 24.

The power voltage Vcc applied to the pad electrode 19 is supplied to an internal circuit 22 and a peripheral circuit 23. The internal circuit 22 is made up of the address buffer 12, address decoder 13, memory 14 and sense amplifier circuit 15. The peripheral circuit 23 is made up of the output circuit 16 and the output buffer circuit 17. Of the two types of ground voltages Vss1 and Vss2, the ground voltage Vss1is applied to the internal circuit 22. The ground voltage Vss2 is applied to the peripheral circuit 23. The rationale for applying two different ground voltages to those circuits is described below.

There are many types of memory ICs. Static RAMs and ROMs, as typical memory ICs, generally use a multi-bit approach, for example, 8 bits or 16 bits, for the output data. The load capacitor 24, a parasite on the pad electrodes for outputting the multibit data is usually about 100 pF. In the memory handling the multibit data, it is required to simultaneously charge and discharge a plurality of load capacitors. At this time, large currents caused by the charge-discharge flow through the power interconnections in the chip. Particularly for ground voltage interconnections of long length and high line resistance and inductance, the flow of a large current therethrough results in a great variation of the ground voltages. Taking the above fact into account, the ground voltage Vss1 is applied to the internal circuit 22, and another ground voltage Vss2 is applied to the peripheral circuit 23 containing the output buffer through which a large current possibly flows. With such ground voltage supplies, even when noise is generated in the ground voltage Vss2, the ground voltage Vss1 is isolated from that noise. In other memory circuits, the ground potential Vss1 is applied to the output circuit 16 as well as the internal circuit 22, and the ground voltage Vss2 is applied to only the output buffer 17.

The IC package is provided with a lead frame containing inner leads and outer leads integral with the inner leads, in addition to the semiconductor chip. Before packaging, the tips or ends of the inner leads are electrically coupled with the pad electrodes by means of metal wires of Au or Al, for example, called bonding wires. After the inner leads and pad electrodes are coupled by the bonding wires, the inner leads, together with the semiconductor chip, are hermetically encapsulated into a cavity, while the outer leads are left outside the cavity. The outer leads are then bent and cut as required, and are used as the external terminals of the DIP type.

FIG. 2 shows the interior of a conventional 28-pin IC package that houses a memory IC chip. A memory IC chip 31 is provided with many pad electrodes including a pad electrode 19 for the power voltage Vcc, and pad electrodes 20 and 21 for the ground voltages Vss1 and Vss2. Reference numerals 32 designate inner leads on a lead frame; reference numerals 33 designate bonding wires; and reference numeral 34 designates a cavity. In the illustration, pad electrodes other than those for power voltages and the outer leads on the lead frame are omitted for simplicity.

As illustrated, the ground voltage for use in the circuits handling large currents such as the output buffer is different from the ground voltage for the remaining circuits. The lead frame, however, is common for both the inner and output leads.

In recent high speed memory devices with reduced access times, a variation of the ground voltage which is due to the inductance components of the lead frame for the ground voltage supply, becomes significant. Let us obtain an inductance of the inner lead 32 on the lead frame for ground voltage supply in the structure as shown in FIG. 2 A self-inductance of the inner lead may be approximated by:

$$L = 2l\left(\frac{2l}{w+t} + 0.5 + 0.224\frac{w+t}{l}\right) \quad (nH) \quad (1)$$

where
l: Length of the inner lead,
w: Width of the same,
t: Thickness of the same.

We have 12.8 nH, when the following specific values are applied to the above formula: l=1.5 cm, w=0.05 cm, and t=0.02 cm.

Let us obtain a discharge current of the output buffer in the memory device of FIG. 1. A portion including mainly the output buffer circuit 17 may equivalently be depicted as shown in FIG. 3. In FIG. 3, C represents the load capacitance; Q represents an n-channel output transistor in the output buffer circuit 17 for discharging the load capacitor C; L represents a self-inductance component existing in the inner lead on the lead frame for the ground voltage supply. The equivalent circuit of FIG. 3 represents the memory device when the discharge of the load capacitor C progresses. In this operation mode, a p-channel output transistor for charging purposes which is connected to a power voltage Vcc in the output buffer is in an off state. Therefore, it is omitted in the illustration. When the memory device is an 8-bit type, the capacitance of the load capacitor C is 800 pF because a capacitance for one bit is 100 pF, and hence 100 pF×8=800 pF. Generally, the channel width W and the channel length L of one output transistor are: W=300 μm and L=2.2 μm. The equivalent channel width W and channel length L of the output transistor Q for 8 bits are 2400 μm and 2.2 μm.

In the above equivalent circuit, a variation of a discharge current $I_s$ was simulated by a computer under conditions that the load capacitor C is charged at 5 V by a signal $D_{in}$, and signal $D_{in}$ is applied to the gate of the output transistor Q, as shown in FIG. 4. The variation of the discharge current $I_s$ simulated was shown in FIG. 5. Noise appearing in the ground voltage Vss2 is proportional to a rate of change of the discharge current $I_s$ with respect to time "t", viz., $dI_s/dt$. A maximum changing rate of discharge current, i.e., $dI_s/dt$ (max), is defined by an inclination of a slanted line A, and approximately 78×10⁶ (A/sec). Accordingly, a maximum ground voltage Vss2 (max) at the pad electrode 21 when the load capacitor is discharged is $$Vss2(max) = L \times dI_s/dt(max) \qquad (2)$$

Substituting the above specific figures, L=12.8 nH and $dI_s/dt(max)=78\times10^6$ A/sec, into the relation (2), we have Vss2(max)=1 V. This shows that in the memory IC shown in FIG. 2, a potential at the pad electrode 21 which should be at 0 V, rises up to a maximum of 1 V. This great voltage variation at the electrode 21 transfers to the pad electrode 20. Because of this, the internal circuit of the conventional memory IC tends to operate improperly.

SUMMARY OF THE INVENTION

Accordingly, an object of the present invention is to provide a semiconductor integrated circuit which minimizes the power noise in the power supply path, thereby almost eliminating the improper operation of the internal circuit.

According to one aspect of the present invention, there is provided a semiconductor integrated circuit comprising: a semiconductor chip having a plurality of pad electrodes on a major surface thereof; a cavity for housing the semiconductor chip; a plurality of leads each including an inner lead and an outer lead; metal wires each for electrically connecting the tip of each the inner lead to one pad electrode; and one of the plurality of leads whose inner lead has a larger area than those of the other leads, the lead supplying a power voltage.

According to another aspect of the present invention, there is provided a semiconductor integrated circuit comprising: a semiconductor chip having a plurality of pad electrodes on a major surface thereof; a cavity for housing the semiconductor chip; a plurality of leads each including an inner lead and an outer lead; metal wires each for electrically connecting the tip of each the inner lead to one pad electrode; and one of the plurality of leads whose inner lead is branched into a plurality of leads, the lead supplying a power voltage.

BRIEF DESCRIPTION OF THE DRAWINGS

FIG. 3 is an equivalent circuit diagram of a part of the circuit of FIG. 1;

FIG. 4 shows a waveform of a signal used in the FIG. 3 circuit;

FIG. 12 is a plan view showing a pattern within a cavity of a semiconductor integrated circuit according to a 6th embodiment of the present invention;

DETAILED DESCRIPTION OF THE PREFERRED EMBODIMENTS

Figure 6:
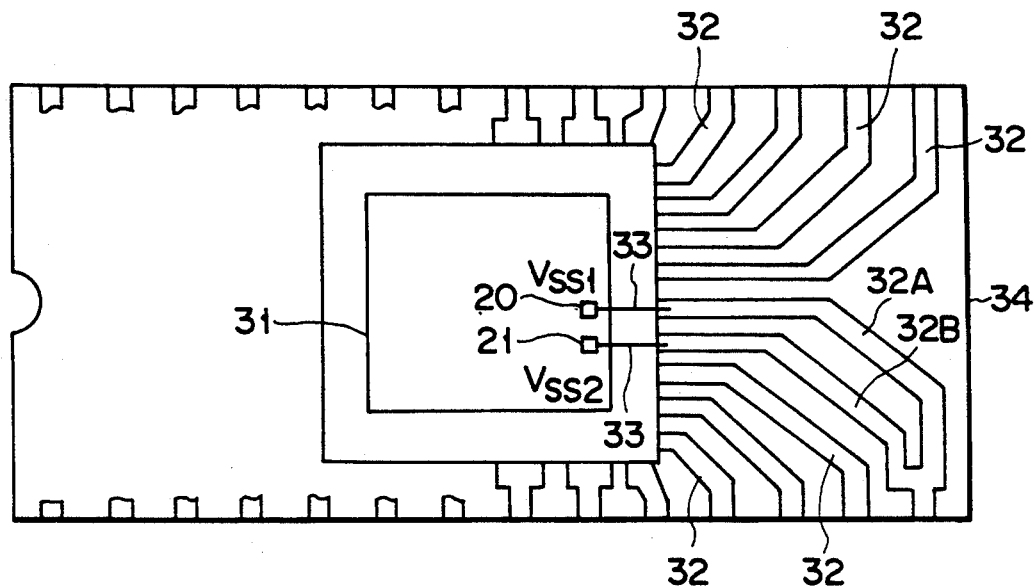
FIG. 6 is a plan view showing a pattern within a cavity of a semiconductor integrated circuit according to a first embodiment of the present invention.
Figure 7:
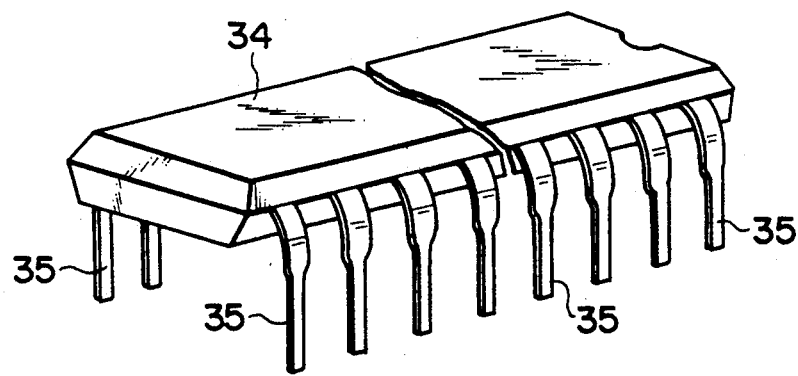
FIG. 7 shows a perspective view of the semiconductor IC of FIG. 6.

Referring to FIG. 6, there is shown a package of a semiconductor integrated circuit according to a first embodiment of the present invention. The integrated circuit (IC) package, like the IC package already described with reference to FIG. 2, uses a memory IC chip 31 with two pad electrodes 20 and 21 for receiving two ground voltages Vss1 and Vss2. In FIG. 6, reference numerals 32 designate inner leads; reference numerals 33 designate bonding wires; and reference numeral 34 designates a cavity. In FIG. 6, the pad electrode for the power voltage other than the ground voltages is omitted as well as the outer leads of the leads. In FIG. 7, perspectively showing an appearance of the IC package under discussion, outer leads 35 of leads extend outside the cavity, are properly bent and cut, and are used as external terminals of the dual-in-line (DIP) type.

As best illustrated in FIG. 6, the inner leads 32 for the supply of the ground voltages Vss1 and Vss2 each branch into two leads 32A and 32B at a portion near the point where the corner of the cavity 34 and the outer lead 35 (not shown in FIG. 6, but shown in FIG. 7)

terminates. Bonding wires 33 electrically connect the tips of the inner leads 32A and 32B to the two pad electrodes 20 and 21 on the chip surface, respectively.

Figure 1:
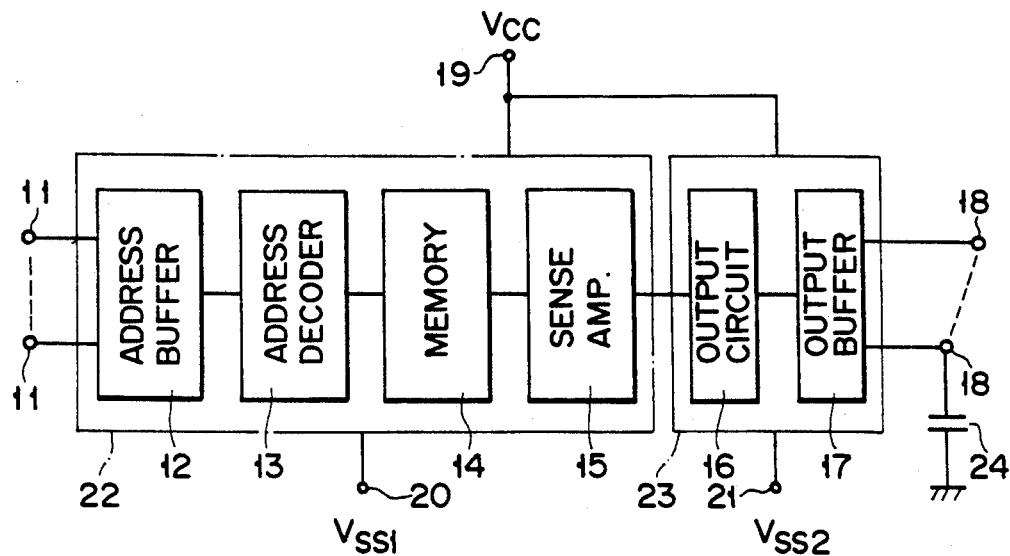
FIG. 1 is a block diagram showing a typical circuit arrangement contained in a conventional memory chip.

Let us consider a situation that, with the above connections in the semiconductor IC package, a large current flows in the peripheral circuit 23 containing the output buffer 17 (see FIG. 1), and the ground voltage Vss2 at the pad electrode 21 instantaneously rises to approximately 1 V. In this situation, the variation in the ground voltage Vss2 is transferred to the coupled with the internal circuit 22 is connected to the outer lead 35 (FIG. 7) through the individual bonding wire 33 and the inner lead 32A which branches from the inner lead 32. The connections with the branched inner leads and the individual bonding wire impede the transfer of the Vss2 variation on the inner lead 32B to the inner lead 32A connecting to the internal circuit 22. Therefore, the ground voltage Vss2 is stable irrespective of the current variation in the output buffer. The proper operation of the internal circuit 22 is always ensured. The connections using the branched inner leads is advantageous particularly in recent high speed memory devices, because these require a flow of simultaneous large current into the output buffer. In the high speed memory devices using the above connections, the internal circuit is insensitive to power noise.

Figure 8:
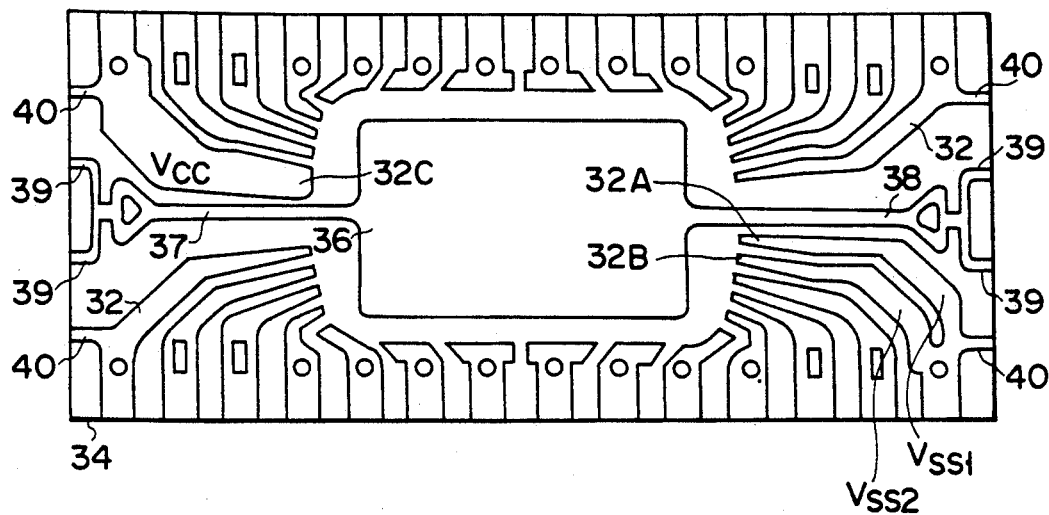
FIG. 8 is a plan view showing a pattern within a cavity of a semiconductor integrated circuit according to a second embodiment of the present invention.

FIG. 8 shows a second embodiment of a semiconductor integrated circuit according to the present invention. FIG. 8 shows a pattern inside a cavity 34 which contains a lead frame and a bed 36 on which a semiconductor chip is placed. In the figure, pins 37 and 38 are continuous to the bed 36, and suspend the bed. Supports 39, which are continuous to the suspending pins 37 and 38, fixedly support these pins.

Also in this embodiment, an inner lead 32 exclusively used for the ground voltage supply forks into two parts in the vicinity of a corner of the cavity 34. One part constitutes an inner lead 32A for the ground voltage Vss1 and the other constitutes an inner lead 32B for the ground voltage Vss2. An inner lead 32C for the power voltage Vcc has a larger area than each inner lead (not shown) for signal input/output use. Further, in the embodiment of FIG. 8, pins 40 are provided at the four corners of the cavity 34. These pins 40 fix the inner leads including the inner leads for the power supply that are laid out at the four corners of the cavity, against their displacement from the correct positions, which possibly occurs when the cavity 34 is formed by a resin molding process, e.g., a transfer molding process.

The feature of a large area of the inner lead 32C for the Vcc voltage effectively reduces the power noise generated in the path of the power voltage Vcc. The additional use of the suspending pins 40 reinforces the inner leads and stably positions them in place even if the number and areas of the inner leads increase.

Figure 9:
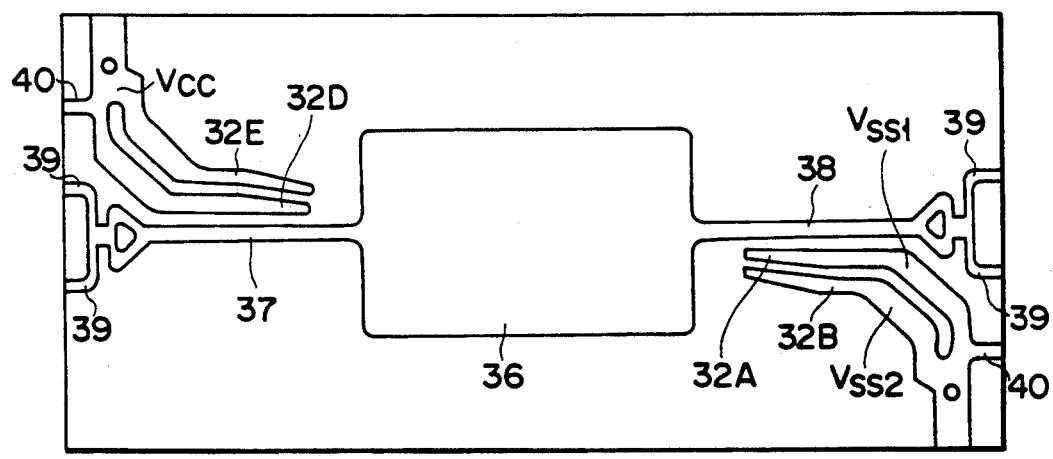
FIG. 9 is a plan view showing a pattern within a cavity of a semiconductor integrated circuit according to a third embodiment of the present invention.

A third embodiment of a semiconductor integrated circuit according to the present invention, is illustrated in FIG. 9. FIG. 9 shows inside a cavity 34 a layout of a lead frame and a bed 36 on which a semiconductor chip is placed. Also in this embodiment, an inner lead 32 exclusively used for the ground voltage supply, forks into two parts in the vicinity of a corner of the cavity 34. One part constitutes an inner lead 32A for the ground voltage Vss1, and the other part constitutes an inner lead 32B for the ground voltage Vss2. An inner lead for the power voltage Vcc also branches into two inner leads 32D and 32E in the vicinity of a corner of the cavity 34. One or two electrode pads may be used for the Vcc supply. When a single electrode pad is used, the branched inner leads 32D and 32E are connected together to a single pad by means of separate bonding wires. Supports 39 respectively fix suspending pins 37 and 38. Reinforcing pins 40 fix the inner leads, including the inner leads for the power supply, that are laid out in the four corners of the cavity 34, against their displacement from the correct positions.

Figure 10:
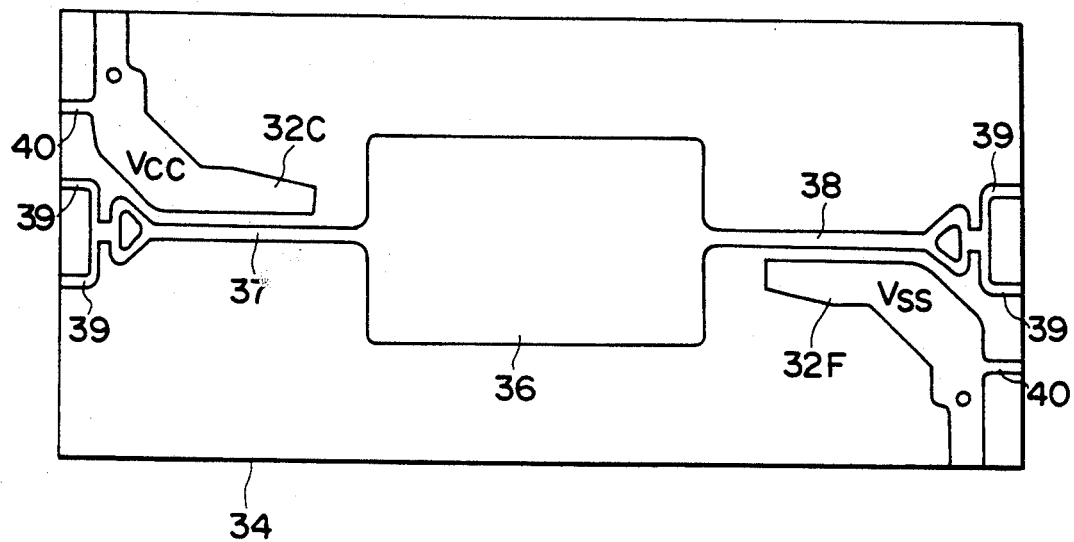
FIG. 10 is a plan view showing a pattern within a cavity of a semiconductor integrated circuit according to a 4th embodiment of the present invention.

A 4th embodiment of a semiconductor integrated circuit according to the present invention, is illustrated in FIG. 10. FIG. 10 shows inside a cavity 34 a layout of a lead frame and a bed 36 on which a semiconductor chip is placed. The 4th embodiment features a single wide inner lead 32F used for the ground voltage Vss supply, in place of the inner leads 32A and 32B (FIG. 8). An inner lead for the Vcc supply is wider than the other inner leads, as in the second embodiment of FIG. 8.

Figure 11:
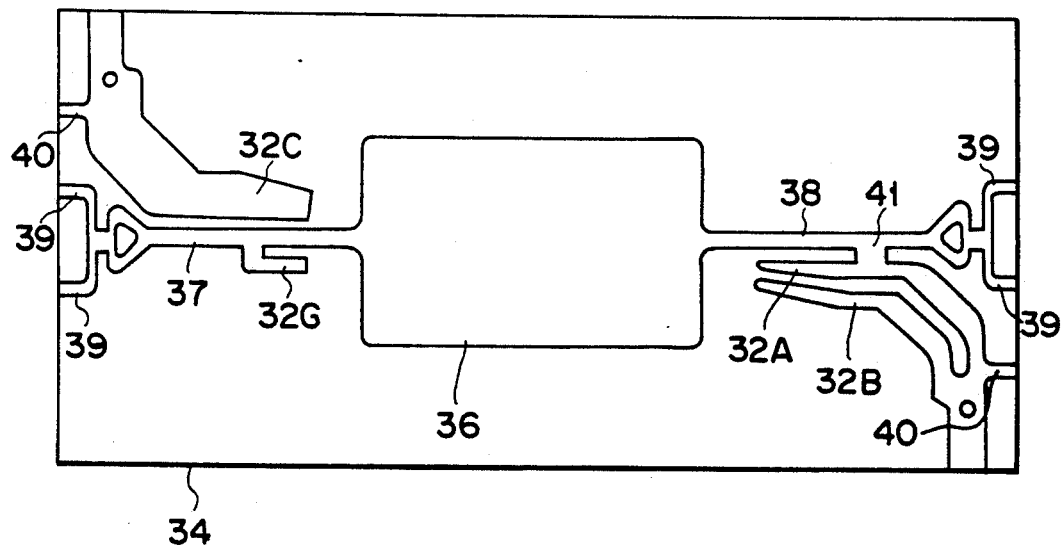
FIG. 11 is a plan view showing a pattern within a cavity of a semiconductor integrated circuit according to a 5th embodiment of the present invention.

A 5th embodiment of a semiconductor integrated circuit according to the present invention, is illustrated in FIG. 11. FIG. 11 shows inside a cavity 34 a layout of a lead frame and a bed 36 on which a semiconductor chip is placed. In the 5th embodiment, an inner lead 32A for the Vss1 supply is connected to a suspending pin 38 by a bridge 41. Another inner lead 32G is formed connecting to another suspending pin 37. The ground voltage Vss1 on the inner lead 32A may be led to the additional inner lead 32G, by way of the bridge 41, pin 38, bed 36, and pin 37. Provision of the inner lead 32G allows use of an additional electrode pad for the Vss supply on the semiconductor chip.

A 6th embodiment of a semiconductor integrated circuit according to the present invention, is illustrated in FIG. 12. FIG. 12 shows inside a cavity 34 a layout of a lead frame and a bed 36 on which a semiconductor chip is placed. In the arrangement shown in FIG. 12, the inner lead for the ground voltage Vss forks into two parts, inner leads 32A for Vss1 and 32B for Vss2, as in the embodiment of FIG. 8, the number of inner leads below the suspending pin 38 is larger than that above the suspending pin 38. Such a pattern with the suspending pin 38 protruded from the mid portion of the bed 36 as viewed in the height of the bed, as in the FIG. 8 embodiment, makes its design difficult, because of an imbalance of the layouts of the inner leads with respect to the suspending pin 38, and a mechanical strength of the inner leads thus laid out must be taken into account.

Figure 2:
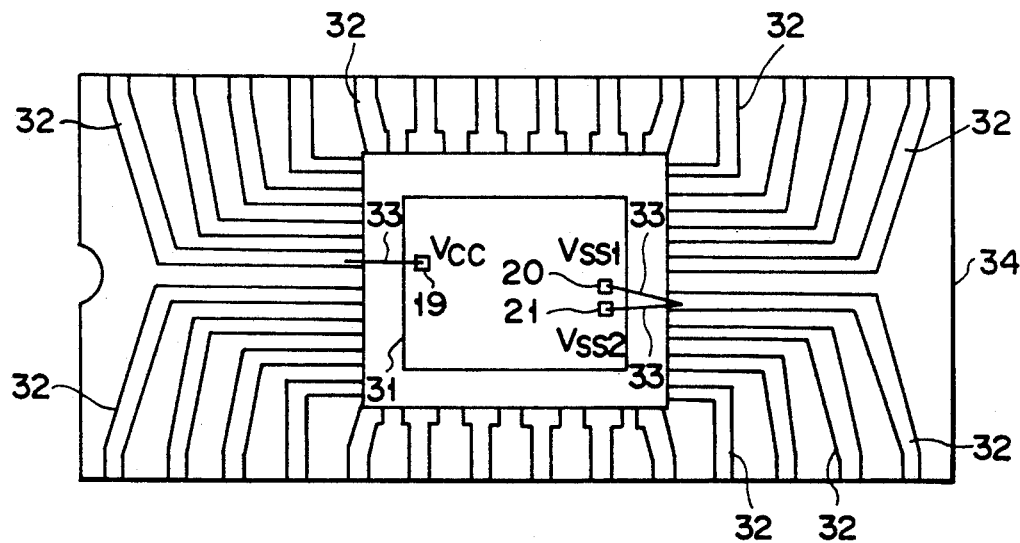
FIG. 2 is a plan view showing a pattern in a cavity of a conventional semiconductor IC package.
Figure 5:
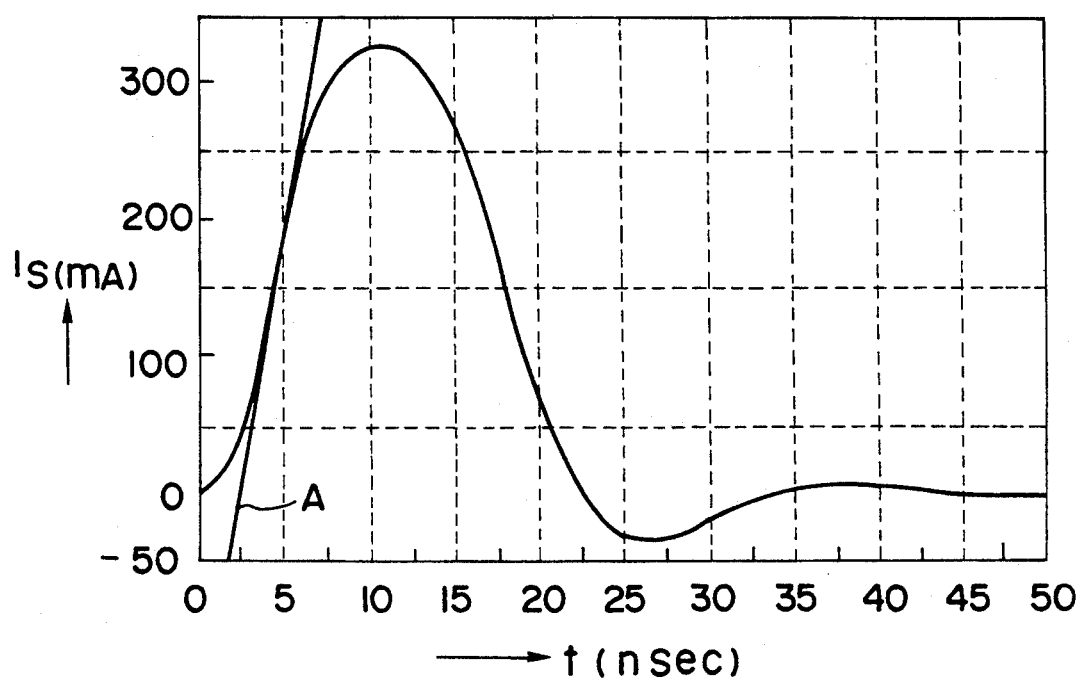
FIG. 5 shows a graphical representation of an electrical characteristic of the FIG. 3 circuit.

To cope with the problem, in the embodiment of FIG. 2, the suspending pin 38 is protruded from a portion of the bed 36 that is shifted upwardly from the mid portion so that the upper and lower inner leads layouts are well balanced with respect to the suspending pin 38.

As seen from the foregoing description, in the first through 6th embodiments, the inner leads for the power voltage Vcc and ground voltage Vss are each configured to have a larger area or to consist of two inner leads. These features successfully reduce the power noise generated in the power voltage paths, with a consequent elimination of improper operation of the internal circuit.

Further, it is noted that in the above-mentioned embodiments, the inner leads other than 32A, 32B and 32C are laid out symmetrically with respect to the suspending pin 38. The above pattern of the inner leads reduces the cost to design dies by which a lead frame of a metal foil is punched to form such a pattern.

Figure 13:
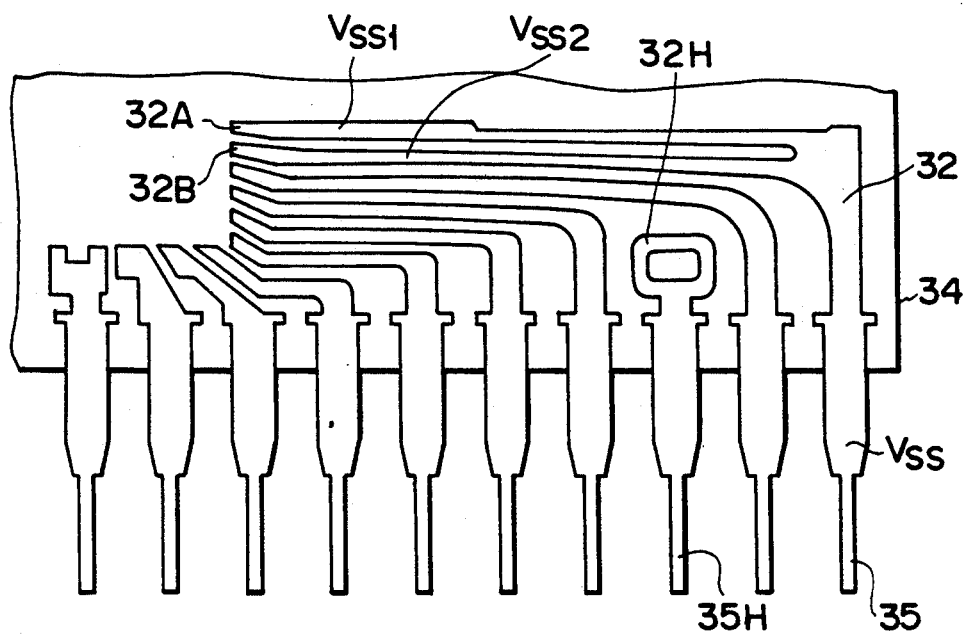
FIG. 13 is a plan view showing a pattern within a cavity of a semiconductor integrated circuit according to a 7th embodiment of the present invention.

A 7th embodiment of a semiconductor integrated circuit according to the present invention, is illustrated in FIG. 13. In FIG. 13, a pattern of leads for the ground voltages Vss1 and Vss2 and those for signal input/output is illustrated. A cavity 34 contains a memory IC chip with two pad electrodes (20, 21) for Vss1 and Vss2 supply (not shown), as in the embodiment of FIG. 6. Reference numeral 32 designates inner leads and numeral 35 designates outer leads, respectively, continuous to the inner leads 32. The portions of the outer leads 34 extending outside the cavity 34 are properly bent and are to be used as external terminals of the DIP type, as in the previous case.

The inner lead 32 of the lead frame, which is for the ground voltage Vss supply, branches into two leads 32A and 32B in a portion closer to one side of the cavity 34. The inner lead 32A is electrically connected at one end to one of the electrode contacts by a bonding wire (not shown). The inner lead 32B is also electrically connected at one end to the other contact by means of another bonding wire (not shown).

Note that one lead is provided not connecting to any of the electrode pads on the chip. In the figure, this lead consists of a circled dummy inner lead 32H and an outer lead 35H. The dummy inner lead 32H is located closer to another side of the cavity 34, and does not extend up to the chip within the cavity.

Let us consider a situation that, with the above connections in the semiconductor IC package, a large current flows in a peripheral circuit 23 containing the output buffer 17 (see FIG. 1), and the ground voltage Vss2 at the pad electrode 21 instantaneously rises to approximately 1 V. In this situation, the variation in the ground voltage Vss2 is transferred to the inner lead 32B. I is noted here that the pad electrode 20 coupled with the internal circuit 22 is connected to the outer lead 35 (FIG. 1) through the individual bonding wire 33, and the inner lead 32A which is branched from the inner lead 32A. The connections with the branched inner leads and the individual bonding wire impedes the transfer of the Vss2 variation on the inner lead 32B to the inner lead 32A connecting to the internal circuit 22. Therefore, the ground voltage Vss2 is stable irrespective of the current variation in the output buffer. The proper operation of the internal circuit 22 is always ensured. The connections using the branched inner leads is advantageous particularly in the recent high speed memory devices, because these require the flow of simultaneous large current into the output buffer. In the high speed memory devices using the above connections, the internal circuit is insensitive to power noise.

Further, the embodiment shown in FIG. 13 uses the dummy inner lead 32H that is located in the end portion of the cavity 34, while failing to reach the chip located in the central portion of the cavity. With the provision of the dummy inner leads 32H, more design freedom can be obtained when the inner leads 32A and 32B are designed. If required, larger areas can be secured for these inner leads 32A and 32B.

Figure 14:
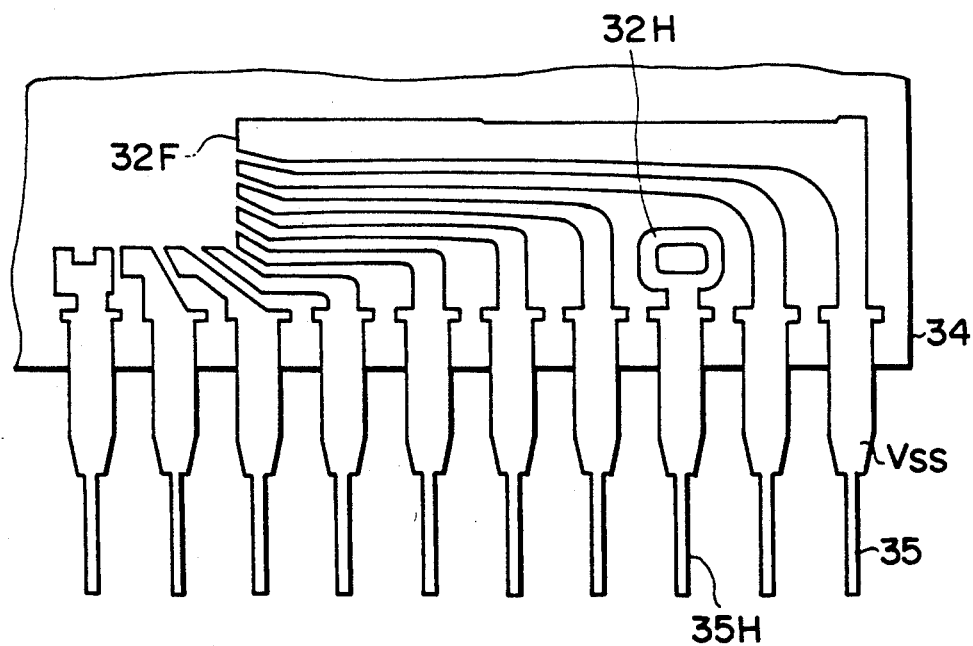
FIG. 14 is a plan view showing a pattern within a cavity of a semiconductor integrated circuit according to an 8th embodiment of the present invention.

An 8th embodiment of a semiconductor integrated circuit according to the present invention, is illustrated in FIG. 14. FIG. 14 shows a pattern of leads for the ground voltage Vss and those for signal input/output. The 8th embodiment features a single wide inner lead 32F used for the ground voltage Vss supply, in place of the inner leads 32A and 32B (FIG. 10). An inner lead for the Vcc supply is wider than the other inner leads, as in the embodiment of FIG. 10.

Also in the embodiment shown in FIG. 14, a dummy lead is provided not connecting to any of electrode pads on the chip. As shown, this lead consists of a circled dummy inner lead 32H and an outer lead 35H. The dummy inner lead 32H is located closer to another side of the cavity 34, and does not extend up to the chip within the cavity 34.

The feature of provision of the wider inner lead 32F for the ground voltage path restricts the power noise generated in this path, hence eliminating the improper operation of the internal circuit.

Another feature of providing the dummy inner lead 32H located in the end portion of the cavity increases a design freedom in designing the wider inner lead 32F.

Figure 15:
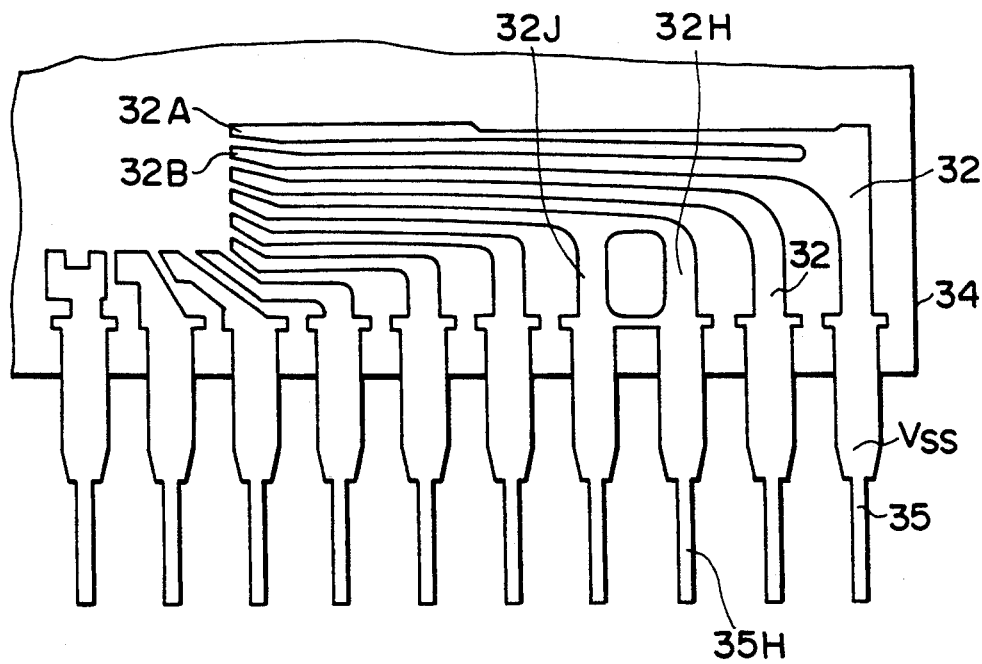
FIG. 15 is a plan view showing a pattern within a cavity of a semiconductor integrated circuit according to an 9th embodiment of the present invention.

A 9th embodiment of a semiconductor integrated circuit according to the present invention, is illustrated in FIG. 15. In FIG. 15, a pattern of leads for the ground voltages Vss1 and Vss2 and those for signal input/output is illustrated. The inner lead of the lead frame, which is for the ground voltage Vss supply, branches into two leads 32A and 32B in a portion closer to one side of the cavity 34. A dummy inner lead 32H is also provided. This dummy inner lead is coupled with another lead 32J for signal input/output that is located adjacent to the dummy inner lead 32H. These leads are coupled with each other in a portion closer to one side of the cavity 34. The coupling of these leads reinforces the inner lead 32J for signal input/output.

Figure 16:
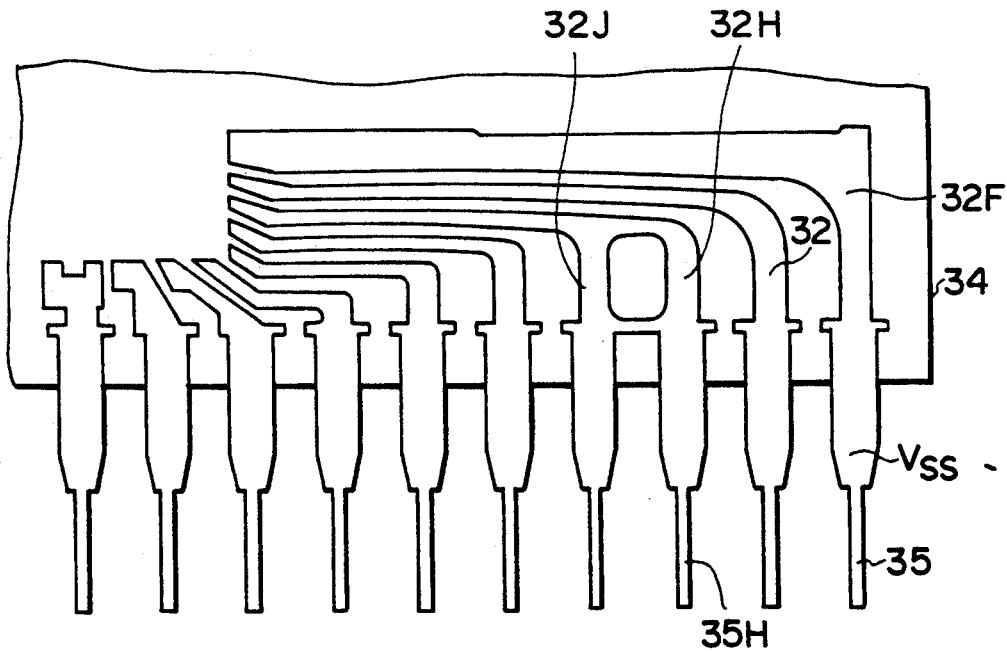
FIG. 16 is a plan view showing a pattern within a cavity of a semiconductor integrated circuit according to an 10th embodiment of the present invention.

A 10th embodiment of a semiconductor integrated circuit according to the present invention is shown in FIG. 16. The inner lead of the lead frame, which is for the ground voltage Vss supply, is wider than other leads. A dummy inner lead 32H is also provided. This dummy inner lead 32N is coupled with another lead 32J for signal input/output that is located adjacent to the dummy inner lead 32H. These leads are coupled with each other in a portion closer to one side of the cavity 34. The coupling of these leads reinforces the inner lead 32J for signal input/output.

As seen from the foregoing description, the embodiments of FIGS. 13 to 16 are each provided with the dummy inner lead 32H. The dummy inner lead 32H is formed near the end portion of the cavity, and does not reach the chip located in the central part of the cavity. This feature enables a designer to design the inner lead for the ground voltage supply having a larger area more flexibly.

As seen from the foregoing description, the present invention has succeeded in solving the problems of the prior art, including the large power noise in the power voltage supply path and the improper operation of the internal circuit due to the power noise.

What is claimed is:
1. A semiconductor integrated circuit comprising:
a semiconductor chip having a surface, including a plurality of pad electrodes fixed to said surface;
a housing defining a cavity for housing said semiconductor chip, said cavity having opposing end portions and a predetermined internal volume;
a plurality of leads, each said lead including an outer lead portion external to said cavity, a first inner lead portion having a first width adjacent said housing, and a second inner lead portion having a second width narrower than said first width extending to said semiconductor chip, one of said plurality of leads being a lead supplying a power voltage, and the second inner lead portion of said lead supplying the power voltage branching into a plurality of adjacent branched second inner lead portions;

a plurality of metal wires, each said metal wire electrically connecting one of said second inner lead portion and one said pad electrode; and a dummy lead disposed between said lead supplying the power voltage and another lead, said dummy lead including an outer lead portion external to said cavity, and an inner dummy lead portion having a width equal to the first radial width, and a termination at one said end portion of said cavity adjacent said housing, wherein the termination of said inner dummy lead portion provides sufficient area within said housing for said plurality of branched second inner lead portions of said lead supplying the power voltage.

2. The semiconductor integrated circuit according to claim 1, wherein said second inner lead portion of said lead supplying power voltage branches into a plurality of branched second lead portions in one said end portion of said housing.

3. The semiconductor integrated circuit according to claim 2, wherein said second inner lead portion of said lead supplying power voltage branches into two adjacent second inner lead portions in one said end portion of said cavity.

4. The semiconductor integrated circuit according to claim 1, wherein one said branched second inner lead portion has a width larger than an adjacent branched second inner lead portion.

5. A semiconductor integrated circuit comprising:
a semiconductor chip having a surface, including a plurality of pad electrodes fixed to said surface;
a housing defining a cavity for housing said semiconductor chip, said cavity having opposing end portions and a predetermined internal volume;
a plurality of leads, each said lead including an outer lead portion external to said cavity, a first inner lead portion having a first width adjacent said housing, and a second inner lead portion having a second width narrower than said first width extending to said semiconductor chip, one of said plurality of leads being a lead supplying a power voltage, and the second inner lead portion of said lead supplying the power voltage having a third width larger than said second width of the second inner lead portions of said plurality of leads adjacent said lead supplying the power voltage;
a plurality of metal wires, each said metal wire electrically connecting one said second inner lead portion and one said pad electrode; and
a dummy lead disposed between said lead supplying the power voltage and another led, said dummy lead having an outer dummy lead portion external to said housing and an inner dummy lead portion having a width equal to the first width, and a termination at one said end portion of said cavity adjacent said housing, wherein the termination of said inner dummy lead provides sufficient area within said housing for said larger third width of the second inner lead portion of said lead supplying the power voltage.

6. The semiconductor integrated circuit according to claim 5, wherein said dummy inner lead portion connects to a first inner lead portion of an adjacent lead other than the power lead.

7. A semiconductor integrated circuit a semiconductor chip having a surface, including a plurality of pad electrodes fixed to said surface;
a housing defining a cavity for housing said semiconductor chip, said cavity having opposite ends and a predetermined internal volume;
a plurality of leads, each said lead including an outer lead portion external to said cavity, a first inner lead portion having a first width adjacent said housing, and a second inner lead portion having a second width larger than said first width extending to said semiconductor chip, one of said plurality of leads being a lead supplying a power voltage, and the second inner lead portion of said lead supplying the power voltage branching into a plurality of adjacent branched second inner lead portions;
a plurality of metal wires, each said metal wire electrically connecting one said second inner lead portion and one said pad electrode;
a bed centrally located in said plurality of second inner lead portions, for mounting said semiconductor chip in said cavity, said bed having a center and opposing sides;
a first suspending pin for supporting said bed extending from one end of said housing to a point on a corresponding side of said bed, offset in a first direction a first distance from a line connecting both opposing sides of said bed extending through said center of said bed;
a second suspending pin for supporting said bed extending from the opposite end of said housing to a point on the corresponding opposite side of said bed, offset in a second direction opposite the first direction of second distance equal to the first distance from said line connecting both opposing sides of said bed extending through said center of said bed, wherein the offset portion of said first and second suspending pins provides sufficient area in said housing for said branched second inner lead portions of lead supplying the power voltage.

8. A semiconductor integrated circuit comprising:
a semiconductor chip having a surface, including a plurality of pad electrodes fixed to said surface;
a housing defining a cavity for housing said semiconductor chip, said cavity having opposing end portions and a predetermined internal volume;
a plurality of first leads, each said first lead including an outer lead portion external to said cavity, a firt inner lead portion having a first width adjacent said housing, and a second inner lead portion having a second width narrower than said first width extending to said semiconductor chip, one of said plurality of first leads being a lead supplying a power voltage, and the second inner lead portion of said lead supplying the power voltage branching into a plurality of adjacent branched second inner lead portions,
a plurality of metal wires, each said metal wire electrically connecting one said second inner lead portion and one said pad electrode; and
a second lead disposed between said lead supplying the power voltage and another adjacent first lead, said second lead including an outer lead portion external to said cavity, and an inner lead portion terminating in an intersection with a first inner lead portion of the adjacent first lead other than the lead supplying the power voltage.

* * * * *